Figure 1:
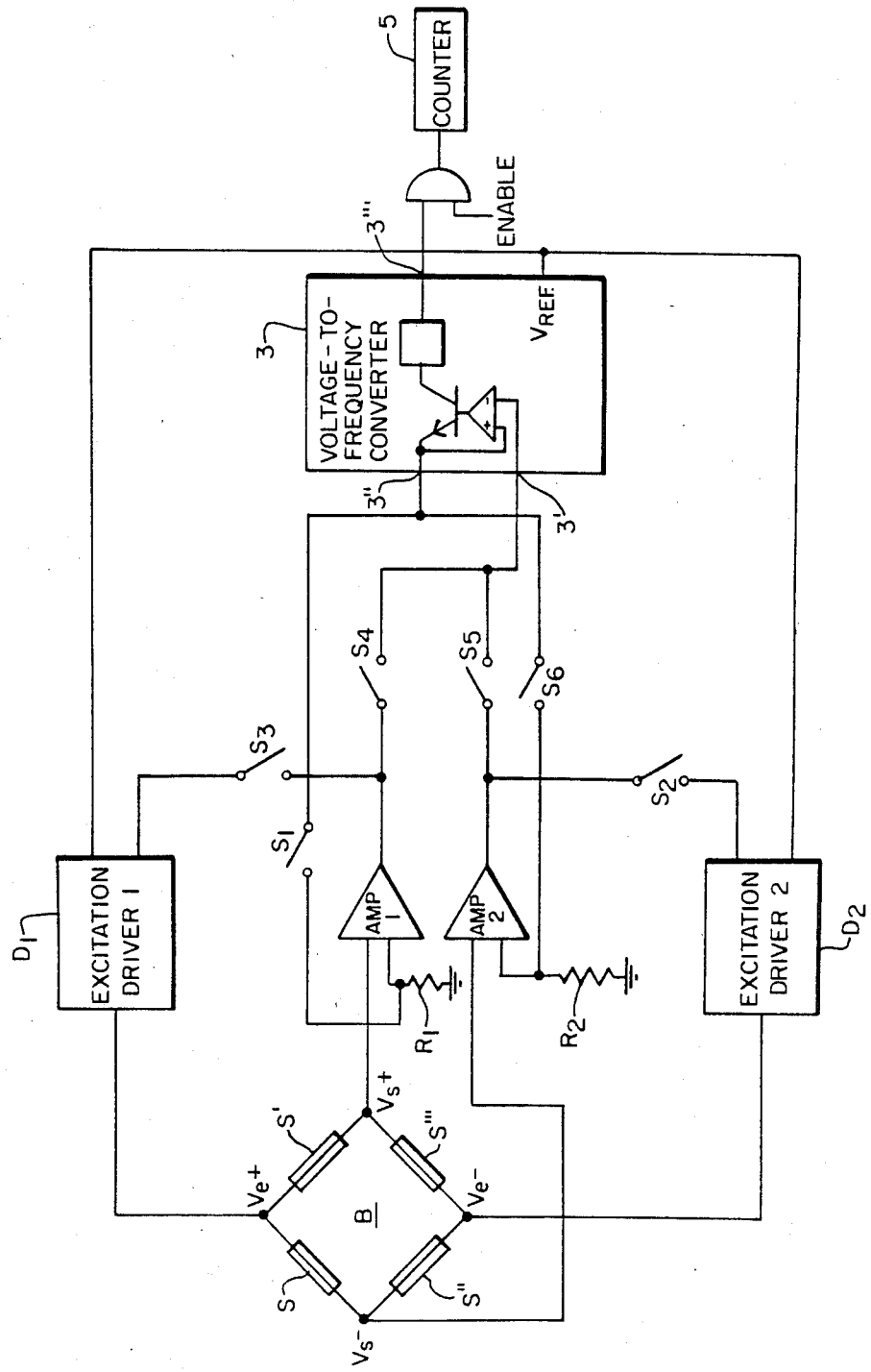

United States Patent [19]

Jarva

[11] Patent Number: 4,560,975
[45] Date of Patent: Dec. 24, 1985

[54] METHOD OF AND APPARATUS FOR ERROR COMPENSATION IN ELECTRONIC ANALOG SENSING SYSTEMS AND THE LIKE

[75] Inventor: Curt Jarva, Hanover, Mass.

[73] Assignee: Indata Corporation, W. Concord, Mass.

[21] Appl. No.: 360,209

[22] Filed: Mar. 22, 1982

[51] Int. Cl.$^4$ .............................................. H03K 13/02
[52] U.S. Cl. ............................ 340/347 CC; 307/491; 330/9; 340/347 AD; 340/347 M
[58] Field of Search .... 340/347 M, 347 CC, 347 AD; 330/77, 9; 307/491–494

[56] References Cited

U.S. PATENT DOCUMENTS 3,940,759 2/1976 Zitelli et al. .................. 340/347 AD

OTHER PUBLICATIONS

Sheingold, The Engineering Staff of Analog Devices, Inc., Transducer Interfacing Handbook, 1980, pp. 125–131; 192–193; 198–199.

Primary Examiner—T. J. Sloyan
Attorney, Agent, or Firm—Rines and Rines, Shapiro and Shapiro

[57] ABSTRACT

Expensive electronics heretofore required to minimize errors introduced by component changes, such as voltage offsets, temperature or linearization errors or the like are avoided by connecting analog sensor and analog-to-digital conversion components all in a novel feedback network with only moderately precise amplifiers, wherein there is automatic compensation through the feedback for such errors in these components, and with only the errors in the amplifiers driving the system producing any impact upon the system operation; and with those errors eliminated by novel chopper stabilization of the whole system, as distinguished from the individual amplifiers.

4 Claims, 2 Drawing Figures

METHOD OF AND APPARATUS FOR ERROR COMPENSATION IN ELECTRONIC ANALOG SENSING SYSTEMS AND THE LIKE

The present invention relates to techniques and apparatus for error compensation in electronic systems, being more particularly directed to systems involving analog sensing and analog-to-digital conversion circuitry.

The most frequent approach to insuring against the deleterious impact of voltage offsets, temperature variations, changes in calibration, such as linearizations, and similar errors introduced into electronic systems during operation, has been to employ stable, expensive components, individually provided with compensatory aids. While the approach to circuit stability and compensation works well in practice, it is not adapted to the myriad of applications where practicalities require only the use of relatively inexpensive or moderately precise components, and where expensive precision circuitry cannot economically or otherwise be employed.

As an illustration, in the case of strain gage analog sensors, excellent stability can be attained by the use of expensive excitation driver circuits, individually chopper-stabilized high quality amplifiers, and stabilized analog-to-digital converters as described, for example, in Transducer Interfacing Handbook, D. H. Sheingold, Analog Devices, pages 192 and 3. In accordance with the present invention, on the other hand, through an entirely different approach to error compensation, only moderately precise operational amplifiers are required, and the sensing and conversion functions and components are connected in a novel type of feedback arrangement that automatically compensates for any errors introduced by these components, and causes only errors of the amplifiers to have an impact upon the system. There errors, in turn, are eliminated by a chopper stabilization technique that, unlike prior individual amplifier choppers, operates upon the whole system. Under this technique, thus, inexpensive components and circuitry are useable in applications requiring a high degree of stability, and without the necessity for highest grade, expensive components and circuits.

An object of the present invention, accordingly, is to provide a new and improved method of and apparatus for error compensation in analog sensing systems and the like that, as before indicated, obviate the requirement for costly components and compensatory techniques, and enable the use of simpler and less precise components.

A further object is to provide such a novel error compensation method and apparatus that are of more general usefulness, as well.

Still another object is the provision of an improved, stabilized strain gage system.

Other and further objects are hereinafter pointed out and are more particularly delineated in the appended claims.

In summary, however, from one of its broader aspects, the invention embraces apparatus for analog sensing and electronic conversion to digital signals with electronic circuit error compensation having, in combination, electric signal-producing sensor means; driver means for exciting the sensor means; operational amplifier means connected to receive the output of the sensor means; analog-to-digital conversion means comprising voltage-to-frequency converter means connected to the operational amplifier means to produce an output frequency signal in response to an amplified sensor signal; feedback connections amongst and embracing all of the converter means, the amplifier means, and the driver means; and switching means for causing feedback signals along said feedback connections to compensate for operational errors in said driver and converter means and isolate the output frequency signal of the converter means from any errors except offset errors and the like of the amplifier means; and means for cancelling out said amplifier means errors in said converter output frequency signal. Preferred details and best mode embodiment description are hereinafter presented.

Figure 2:
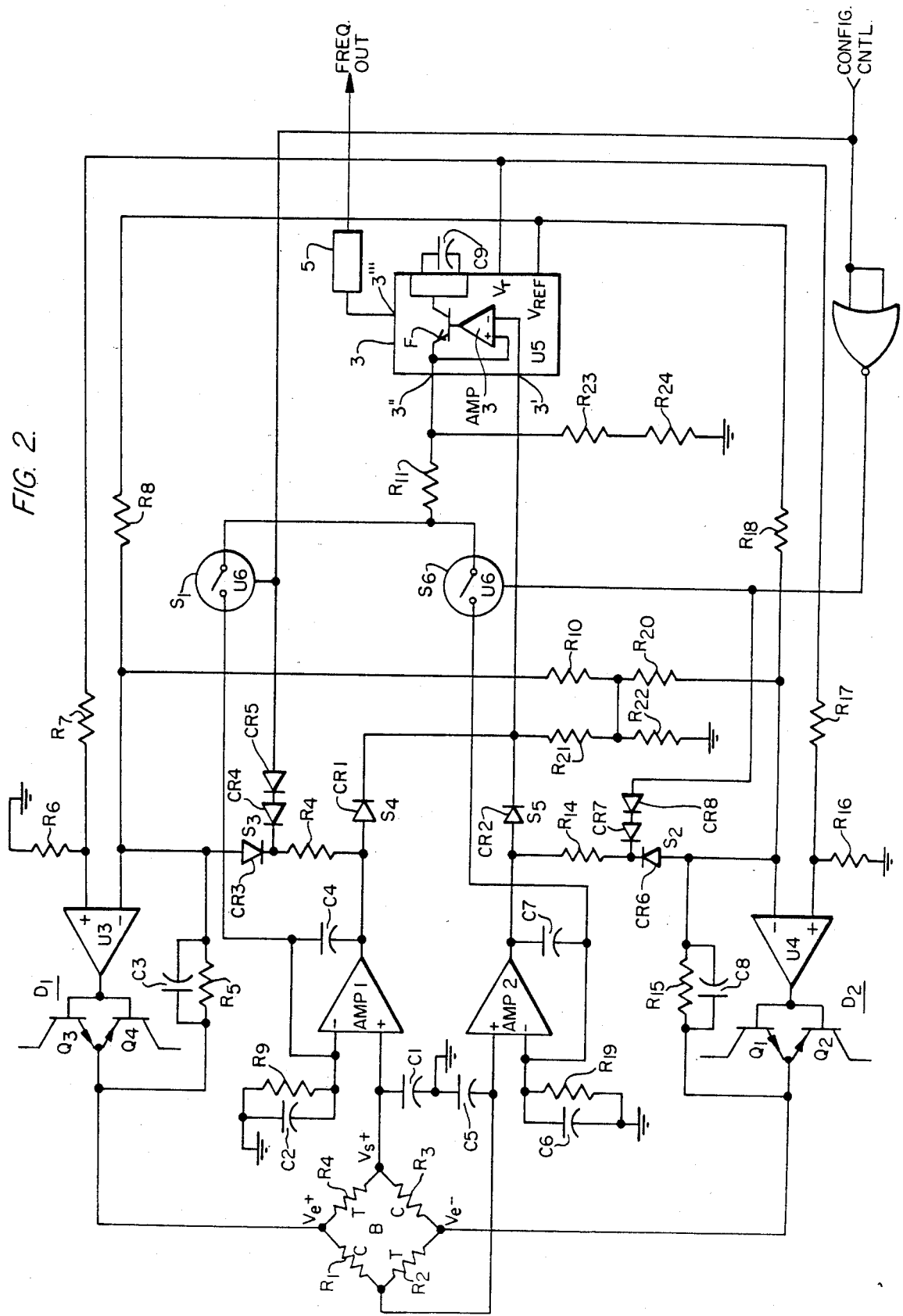

The invention will now be described with reference to the accompanying drawing;

FIG. 1 of which is a block diagram illustrating the method applied to a generalized sensing system; and FIG. 2 is a circuit diagram of a preferred strain gage embodiment.

Referring to FIG. 1, analog sensors S, S', S", S''' are shown connected in a conventional bridge-balancing circuit B, driven by a pair of excitation drivers $D_1$ and $D_2$ at the upper and lower input terminal vertices of the bridge, as indicated by voltages $V_{e+}$ and $V_{e-}$, respectively, with outputs taken from the output terminal vertices at $V_{s-}$ and $V_{s+}$, respectively, as is well known. The output vertex $V_{s+}$ is connected to an input terminal of an upper operational amplifier AMP 1, while the opposite bridge output vertex terminal $V_{s-}$ is connected to an input terminal of a similar lower operational amplifier AMP 2. The other input terminals of amplifiers AMP 1 and AMP 2 are shown similarly grounded through resistors $R_1$ and $R_2$.

In accordance with the invention, for purposes of enabling the utilization of a novel feedback network later explained, the analog-to-digital converter circuit employed has been dissociated into a voltage-frequency converter portion 3 and a counter portion 5, with the output terminal of AMP 1 connected through a switching device, represented schematically by the switch $S_4$ (when closed), to the converter 3, at input 3' thereof. The output of AMP 2 is also connected to the converter 3 at its input terminal 3' when switch $S_5$ is closed; with switches $S_4$ and $S_5$ being oppositely activated so that when one is closed the other is open, and vice versa. The converter 3 feeds back at 3" through switch $S_1$ (when closed) to the lower input terminal of AMP 1, and alternately, feeds back through switch $S_6$ (when closed) to the lower input terminal of AMP 2. The outputs of AMP 1 and AMP 2 are also alternately fed to control respective excitation drivers $D_1$ and $D_2$ when respective switches $S_3$ and $S_2$ are alternately closed, with reference voltages ($V_{Ref}$) being applied from the converter 3 to the drivers, as later explained more fully.

When switches $S_1$, $S_4$ and $S_2$ are closed (and $S_5$, $S_6$ and $S_3$ are open), the excitation driver $D_1$ produces an output $V_{e+}$ at the upper bridge vertex terminal that is a constant times a reference voltage derived from the voltage-to-frequency converter 5. At such time, the output of AMP 2 feeds back through closed switch $S_2$, forcing the excitation driver $D_2$ to force the left-hand output vertex terminal $V_{s-}$ of the sensing bridge to go to "ground" or zero voltage, with an error of whatever offset error exists in AMP 2. AMP 1 meanwhile applies the amplified sensor signal output $V_{s+}$ of the sensing bridge to the voltage-to-frequency converter 3 at 3' and has a feedback to it via 3" from the converter. The frequency $f_1$ at the converter output 3''' is proportional to $V_s+(V_{off1}-V_{off2})$, where $V_{off1}$ is the offset voltage of AMP 1 and $V_{off2}$ that of AMP 2 and $V_s$ is the signal that would exist if there were no offset voltages in AMP 1 and AMP 2.

When the switches $S_5$, $S_6$ and $S_3$ are closed (and switches $S_1$, $S_2$ and $S_4$ are open), the oppositely phased driver $D_2$ produces an output $V_{e-}$ that is a constant times a converter reference voltage. The output of AMP 1 feeds back through closed switch $S_3$ to cause the driver $D_1$ to force the right-hand bridge output terminal $V_{s+}$ to ground, plus whatever offset error exists in AMP 1. AMP 2 meanwhile applies the amplified sensor signal output $V_{s-}$ to the converter 3, receiving feedback from 3″. The output frequency $f_2$ of converter 3 is proportional to $V_s+(V_{off2}-V_{off1})$.

It will be observed that through this novel feedback network embracing all of the components (converter portion 3, operational amplifiers AMP 1 and AMP 2, drivers $D_1$ and $D_2$ and bridge sensors S-S‴), any error effects or inaccuracies of the drivers or converter introduce no effect upon, but are automatically eliminated or isolated from, the converter output 3‴—the only errors being offsets of AMP 1 and AMP 2.

These last-named errors are cancelled out in the chopper stabilization applied to the whole system taken as unit, through averaging over a short internal of time the $[V_s+(V_{off1}-V_{off2})]$ and $[V_s+(V_{off2}-V_{off1})]$ successive output frequencies $f_1$ and $f_2$ of the converter 3, by equal-time successive enabling of the output feeding to counter 5.

It should be noted that any thermal voltages induced in solder connections between the sensors and amplifier inputs behave as if they were components of the input offsets of these amplifiers. Thus the system chopper stabilization described above eliminates dissimilar metal thermal effects that are common problems in low level transducer interfacing.

A practical embodiment applicable to strain gages is shown in FIG. 2, designed in accordance with the concepts of FIG. 1 to provide amplification, temperature compensation, and linearization of minute (microvolts) strain gage bridge outputs for such purposes, for example, as very accurately (0.25%FS) transducing weight into high level voltages and then to digital numbers. As before explained, with low cost as a prime objective, effort has been made to trade time of operation for accuracy and to use medium precision components in the feedback arrangements that compensate for their failings. In the same manner outlined in connection with the basic circuit of FIG. 1, the circuit of FIG. 2 interfaces with the resistive strain gage bridge B (R1-R4) in such a way as, in effect, to chopper-stabilize the input parameters (principally offset voltage and offset voltage drift). This is necessary since the bridge output voltages are so small that the input parameter variations in conventional inexpensive operational amplifiers could produce large inaccuracies.

Strain gages $R_1$-$R_4$ are approximately of equivalent resistance with no strain applied to the system i.e., $R_1=R_2=R_3=R_4=R$. When strain is applied to the system the tension gage ($R_2$, $R_4$) resistances increase by a factor of $(1+\alpha)$, where $\alpha$ is the product of the strain (as in microinches/inch) and the gage factor (microhms/ohm/microinch/inch). The compression gage ($R_1$, $R_3$) resistances decreased by a factor of $(1-\alpha)$. When AMP 2 is connected in feedback to the $V_{e-}$ excitation driver $D_2$, $V_{s-}$ is forced to ground with an error of the AMP 2 input offset voltage $V_{off2}$. $V_{s+}$ can then be shown to be equal to $$\frac{-2\alpha V_{e+} + (1+\alpha)V_{off2}}{(1-\alpha)}.$$

For $\alpha<<1$, $V_{s+}$ is then approximately $-2\alpha V_{e+}+V_{off2}$. In practice, $\alpha$ is of the order of $2.5\times10^{-3}$ at most.

When the switches are exercised such that the configuration is reversed and AMP 1 is connected in feedback to the $V_{e+}$ excitation driver $D_1$, $V_{s-}$ can be shown, again for $\alpha<<1$, to be substantially $-2\alpha V_{e-}+V_{off1}$. If each amplifier AMP 1 and AMP 2, when connected to the voltage-to-frequency converter, has gain K, the frequency $f_1$ (for $\alpha<<1$) is, more precisely, substantially $K(-2\alpha V_{e+}+V_{off2}-V_{off1})$. Frequency $f_2$ for the same conditions is substantially $K(-2\alpha V_{e-}+V_{off1}-V_{off2})$.

The $V_{e+}$ and $V_{e-}$ in these equations are equivalent to each other since they both are derived by a similar amplification of the reference voltage $V_{Ref}$. An output $f_1$ occurs when $V_{e+}$ equals $c\,V_{Ref}$, and $V_{e-}$ is driven by AMP 2 in feedback, while $f_2$ is output when $V_{e-}$ equals $c\,V_{Ref}$ and $V_{e+}$ is driven by AMP 1 in feedback, where c is the same constant. If the two output frequencies $f_1$ and $f_2$ are averaged over equal time intervals by counting pulses for two equal periods, since $\alpha<<1$, the offset error contributions have been reduced significantly.

In FIG. 2 the driver $D_1$ comprises amplifier U3 and driver transistors $Q_3$-$Q_4$, and driver $D_2$ embodies amplifier U4 and drives $Q_1$-$Q_2$. The voltage-to-frequency converter 3 is illustrated as using an emitter follower F with feedback to amplifier AMP 3, with reference voltage $V_R$ provided to the drivers $D_1$ and $D_2$. The switching at $S_1$ and $S_2$ is controlled by "config. cntl" (lower right), with diode switches (CR3, 4, 5 serving the function of $S_3$ of FIG. 1; CR1, $S_4$; CR2, $S_5$; and CR6, 7, 8, $S_2$).

When the "config cntl" input signal is a logic high, U3 of driver $D_1$ is decoupled from AMP 1 and provides an output voltage through Q3 and Q4 which is proportional to the reference voltage (such as IV) and some other parameters, discussed later. This output voltage $V_{e+}$ is used as the bridge excitation. Meanwhile the output of AMP 2 is connected in negative feedback loop through U4 of driver $D_2$ and the strain gage bridge to the output at U5 of AMP 3 of converter 3, fed back to the input of AMP 2. This feedback loop forces $V_{e-}$ (the output of U4 of driver $D_2$) to be whatever voltage is necessary to make $V_{s-}$ equal to ground plus whatever the offset voltage of AMP 2 may be. Since R1-R4 under all loading conditions are never very different from one another, the feedback voltage $V_{e-}$ will be roughly equal to $V_{e+}$ in magnitude and of opposite sign (positive). Note that when the strain (such as weight) measured increases, with tension (T) sensing gages R2 and R4 increasing in resistance and compression (C) gages R1 and R3 decreasing in resistance, voltage $V_{e-}$ must increase in magnitude to maintain $V_{s-}$ at ground.

In this configuration, AMP 1 is connected as a signal amplifier of the output $V_{s+}$ with its output connected to the voltage follower circuit AMP 3-F of the voltage-to-frequency converter 3 such that the voltage follower output is forced to be that value necessary to satisfy the negative feedback conditions of AMP 1. This voltage will be equal to some gain K times the input $V_{s+}$ as determined by resistors R11 and R9. Resistors R23 and R24 cause a current to output from the voltage-to-frequency converter 3 which is proportional to the follower output voltage and in turn to the voltage $V_{s+}$.

Since U5 of the converter 3 and U4 of the driver $D_2$ are connected in feedback loops controlled by AMP 1 and AMP 2, respectively, variation in the input parameters of the voltage-to-frequency converter and excitation drivers (due to temperature, age, etc.,) will not affect the output, as before pointed out. The output frequency of the converter 3 may then be used to drive counter 5 which is enabled for a precise period, to convert this frequency to a digital number of desired precision, proportional to $V_{s+}$.

It turns out, moreover, that $V_{s+}$ itself is proportional to four times the excitation voltage $V_{e+}$ times the train (in microinches/inch) in the gage (for strain gages with a gage factor of 2). In addition, as previously mentioned, there is an error voltage equal to the offset voltage of AMP 2. The feedback voltage to the negative input terminal of AMP 1 is also inaccurate by a margin equal to the offset voltage of AMP 1. Thus, as earlier stated, it can be seen that the output frequency $f_1$ is proportional to the desired bridge output signal $V_{s+}$ with an error term equivalent to the AMP 1 offset voltage minus the AMP 2 offset voltage ($V_{off1} - V_{off2}$).

When the "config cntl" is switched to a logic "0", the roles of all the operational amplifiers are switched, with driver $D_2$ now providing the bridge excitation and AMP 2 being connected to the voltage-to-frequency converter 3 and providing signal amplification. $V_{e+}$ and $V_{e-}$ will each change polarity when this occurs. Because of symmetry, the output voltage $V_{s-}$ under these conditions will also be proportional to four times the excitation voltage ($V_{e-}$) times the strain, plus an error voltage. This error voltage however is equal to the offset voltage of AMP 1. The net result is the converter output signal will have a frequency $f_2$ proportional to the desired bridge output signal $V_{s-}$ with an error term equivalent to the AMP 2 offset voltage minus the AMP 1 offset voltage ($V_{off2} - V_{off1}$), as before stated.

If these two frequencies are averaged together by allowing them to drive the counter 5 for two equal periods, the resultant number in the counter will be independent of the AMP 1 and AMP 2 offset voltages (and drifts of these voltages). Thus, by using averaging techniques and judicious use of the feedback circuits above delineated, inexpensive components have been boosted in performance to the higher-priced variety.

The other parameters before-mentioned consist of inputs to allow compensation for temperature change and transducer non-linearity. Referring to FIG. 2, the $V_T$ output of the voltage-to-frequency converter 3 (U5) is a temperature sensitive output (1 mV/°K.) that through connection to R6+R7 to U3 and R16+R17 to U4 is used to lower the excitation voltage output with increasing temperature to compensate for the tendency of the transducer to become more flexible and give greater output as temperature rises. Again referring to FIG. 2, resistors R21, R22, R10 and R20 are used to feed a small amount of signal back into the excitation drivers. This has no effect at low transducer loading but works to increase the excitation voltage and thus the signal voltage slightly at the high end of transducer loading to compensate for the usual transducer tendency to start dropping off in output as deflections get high.

A typical voltage-to-frequency converter 3 that could be used in this application is an Analog Devices AD537KH (2 mV input offset, 1 μV/°C. offset drift). Suitable operational amplifiers AMP 1 and AMP 2 may be of the Analog Devices type AD517JH (150 μV input offset, 3 μV/°C. offset drift); amplifiers AMP 3, U3 and U4 may be of the types RCA CD3140 or Motorola CF355; and electronic switches $S_1$ and $S_2$ of type RCA CD4066.

A practical application of the interface circuit of FIG. 2, operable with a 350-ohm resistive strain gage bridge, was found to provide over-all drift of less than 0.005%/°C., a non-linearity of 0.05%, maximum, and an accuracy of greater than 0.2% over a temperature range of from 0°–50° C.

While the invention has been described in connection with a four-element sensing bridge, clearly half-bridges or other equivalent sensor circuits may be also employed with the techniques of the invention. As to generalizing the sensor arrangement, while the circuit of the invention is designed specifically for bridge type operation, the actual sensing device need not be a bridge. The other arms of the bridge, furthermore, need not be actively sensing devices and can be associated with the circuitry instead of the sensing element. Other modifications will also occur to those skilled in the art which are considered to fall within the spirit and scope of the invention as delineated in the appended claims.

What is claimed is:

1. Apparatus for analog sensing and electronic conversion to digital signals with electronic circuit error compensation having, in combination, electric signal-producing sensor means; driver means for exciting the sensor means; operational amplifier means connected to receive the output of the sensor means; analog-to-digital conversion means comprising voltage-to-frequency converter means connected to the operational amplifier means to produce an output frequency signal in response to an amplified sensor signal; feedback connections amongst and embracing all of the converter means, the amplifier means, and the driver means; and switching means for causing feedback signals along said feedback connections to compensate for operational errors in said driver and converter means and isolate the output frequency signal of the converter means from any errors except offset errors and the like of the amplifier means; and means for cancelling out said amplifier means errors in said converter output frequency signal.

2. Apparatus as claimed in claim 1 and in which the error cancelling means comprises means for time-averaging the output frequency signals and counter means for storing the same as digital information.

3. Apparatus as claimed in claim 1 and in which said sensor means comprises a bridge circuit having pairs of input and output terminals; said driver means comprises a pair of opposite-phase drivers connected to opposite bridge input terminals; and said operational amplifier means comprises a pair of amplifiers, one connected to each output terminal of the bridge; and wherein said switching means causes each amplifier alternately to feed bridge sensor output signals to the converter means, with feedback therefrom along said feedback connections, while the other amplifier forces the corresponding driver effectively to ground the other bridge output terminal.

4. Apparatus as claimed in claim 3 and in which the signals fed at the time of the successive switchings of the switching means by the respective amplifiers to the converter means are related, respectively, to $[V_{s+} + (V_{off1} - V_{off2})]$, and $[V_{s+} + (V_{off2} - V_{off1})]$, where $V_{s+}$ is the sensor bridge output signal that would be present if no offset voltages existed, and $V_{off1}$ and $V_{off2}$ are the respective offset error voltages of the amplifiers.

* * * * *